(12) United States Patent
Sato et al.

(10) Patent No.: US 11,346,885 B2
(45) Date of Patent: May 31, 2022

(54) WINDING INTERLAYER SHORT-CIRCUIT DETECTION APPARATUS AND WINDING INTERLAYER SHORT-CIRCUIT DETECTION METHOD

(71) Applicants: KABUSHIKI KAISHA TOSHIBA, Tokyo (JP); Toshiba Energy Systems & Solutions Corporation, Kawasaki (JP)

(72) Inventors: Takahiro Sato, Kawasaki Kanagawa (JP); Masafumi Fujita, Yokohama Kanagawa (JP); Norio Takahashi, Yokohama Kanagawa (JP); Ken Nagakura, Ebina Kanagawa (JP); Koji Ando, Yokohama Kanagawa (JP); Yoichi Tomoe, Yokohama Kanagawa (JP)

(73) Assignees: Kabushiki Kaisha Toshiba, Tokyo (JP); Toshiba Energy Systems & Solutions Corporation, Kawasaki (JP)

( * ) Notice: Subject to any disclaimer, the term of this patent is extended or adjusted under 35 U.S.C. 154(b) by 0 days.

(21) Appl. No.: 17/203,037

(22) Filed: Mar. 16, 2021

(65) Prior Publication Data
US 2021/0293886 A1 Sep. 23, 2021

(30) Foreign Application Priority Data

Mar. 17, 2020 (JP) .............................. JP2020-046127

(51) Int. Cl.
| | | |
|---|---|---|
| G01R 31/34 | (2020.01) | |
| H02P 23/14 | (2006.01) | |
| G01R 19/165 | (2006.01) | |
| G01R 31/52 | (2020.01) | |

(52) U.S. Cl.
CPC ..... *G01R 31/346* (2013.01); *G01R 19/16538* (2013.01); *G01R 31/52* (2020.01); *H02P 23/14* (2013.01)

(58) Field of Classification Search
CPC ............ G01R 31/346; G01R 19/16538; G01R 31/52; G01R 31/72; H02P 23/14; H02P 29/024
See application file for complete search history.

(56) References Cited

U.S. PATENT DOCUMENTS

2015/0198668 A1* 7/2015 Viswanathan ....... G01R 31/343
322/99
2021/0033674 A1 2/2021 Hirano

FOREIGN PATENT DOCUMENTS

| JP | H06-245368 A | 9/1994 |
| JP | 2018-163645 A | 10/2018 |
| JP | 2021-023050 A | 2/2021 |

* cited by examiner

*Primary Examiner* — Farhana A Hoque
(74) *Attorney, Agent, or Firm* — Foley & Lardner LLP

(57) ABSTRACT

According to one embodiment, a winding interlayer short-circuit detection apparatus includes a processor configured to perform at least an interlayer short-circuit detecting process to detect, based on a difference between a measurement value of a field current in a field winding of a brushless exciter and a reference value, and based on a difference between a calculated value of an armature reaction voltage induced in the field winding of the brushless exciter and a reference value, a presence or absence of an interlayer short-circuit that may occur in any of the field winding of the brushless exciter, an armature winding of the brushless exciter, and a field winding of a rotary electric machine body.

18 Claims, 9 Drawing Sheets

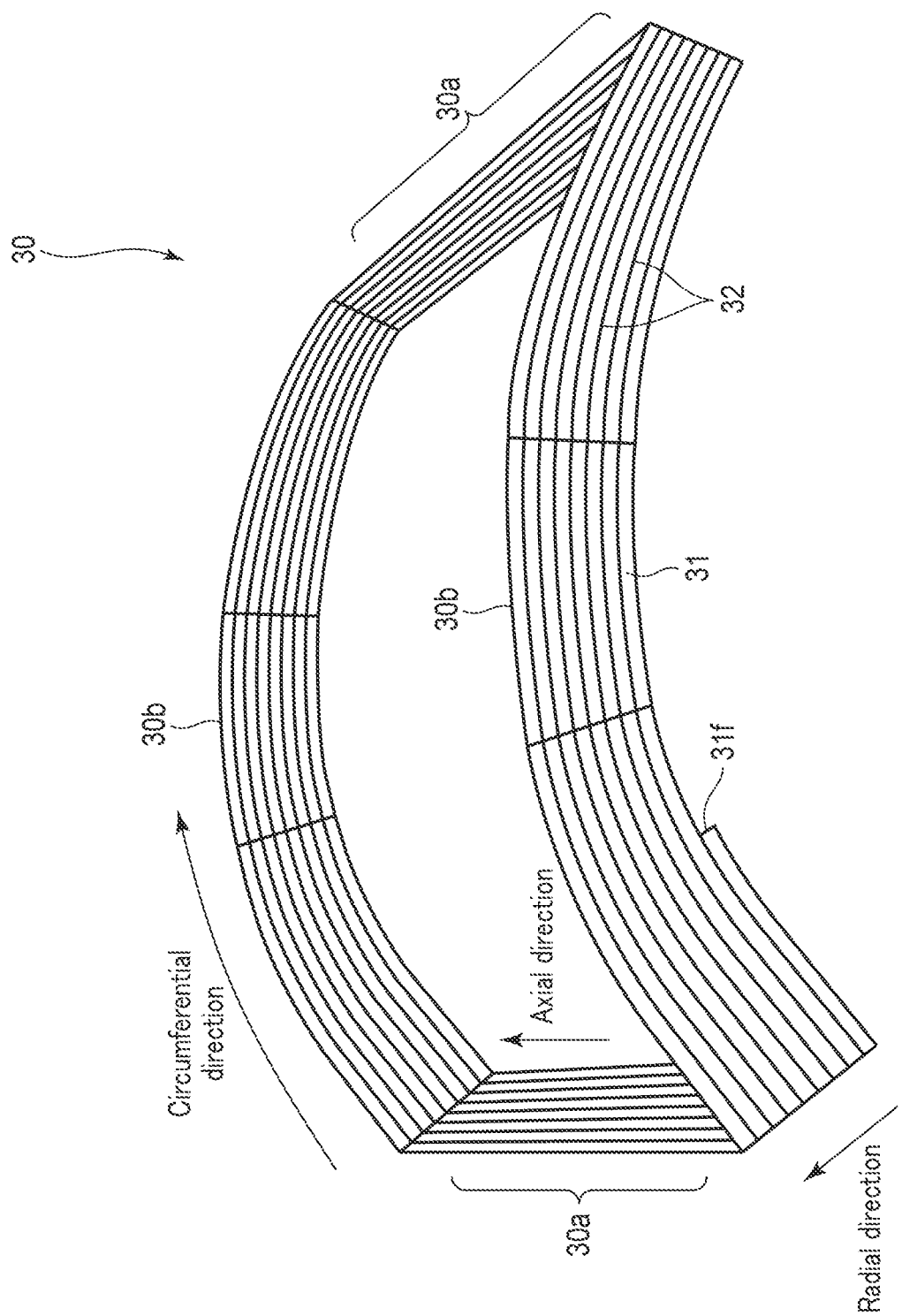
F I G. 2

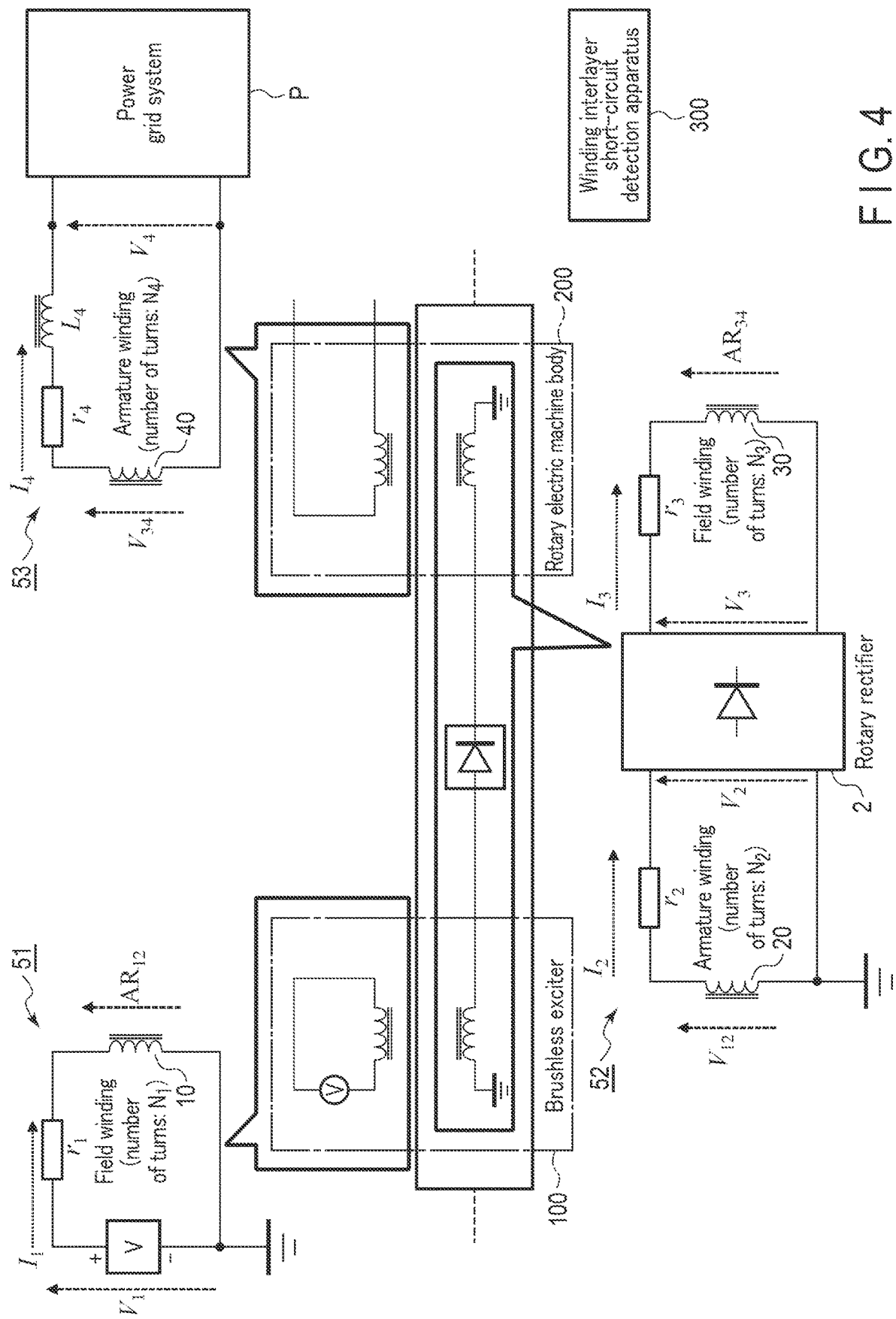
F I G. 4

| Circuit equation for brushless exciter's field winding | Circuit equation for brushless exciter's armature winding |
|---|---|
| $v_1 = r_1 i_1 + \underbrace{\omega M_{12} i_2}_{AR_{12}}$  ...(1) | $\begin{pmatrix} v_2^d \\ v_2^q \end{pmatrix} = \begin{pmatrix} r_2 & -\omega L_2^q \\ \omega L_2^d & r_2 \end{pmatrix} \begin{pmatrix} i_2^d \\ i_2^q \end{pmatrix} + \underbrace{\begin{pmatrix} 0 \\ \omega M_{12} i_1 \end{pmatrix}}_{V_{12}}$  ...(2) |
| Circuit equation for rotary electric machine body's field winding | Circuit equation for rotary electric machine body's armature winding |
| $v_3 = r_3 i_3 + \underbrace{\omega M_{34} i_4}_{AR_{34}}$  ...(3) | $\begin{pmatrix} v_4^d \\ v_4^q \end{pmatrix} = \begin{pmatrix} r_4 & -\omega L_4^q \\ \omega L_4^d & r_4 \end{pmatrix} \begin{pmatrix} i_4^d \\ i_4^q \end{pmatrix} + \underbrace{\begin{pmatrix} 0 \\ \omega M_{34} i_3 \end{pmatrix}}_{V_{34}}$  ...(4) |

F I G. 5

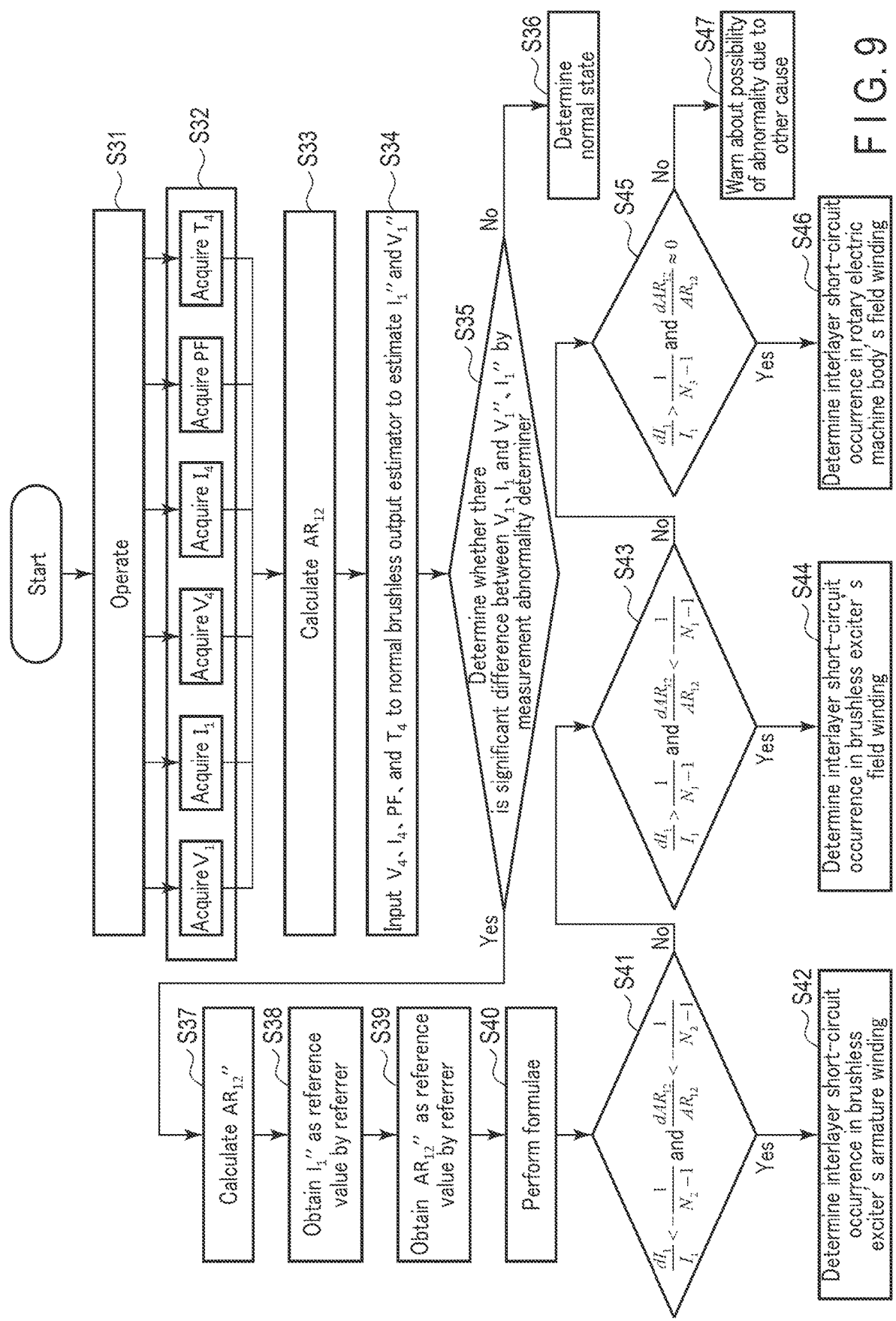

WINDING INTERLAYER SHORT-CIRCUIT DETECTION APPARATUS AND WINDING INTERLAYER SHORT-CIRCUIT DETECTION METHOD

CROSS-REFERENCE TO RELATED APPLICATIONS

This application is based upon and claims the benefit of priority from Japanese Patent Application No. 2020-046127, filed Mar. 17, 2020, the entire contents of which are incorporated herein by reference.

FIELD

Embodiments described herein relate generally to a winding interlayer short-circuit detection apparatus and a winding interlayer short-circuit detection method.

BACKGROUND

It is a common structure for a wound-field rotary electric machine such as a turbine generator to include in its rotor or stator a field circuit for generating a magnetic field.

In the field circuit, a magnetic field is generated by a field winding, which is a component typically constituted by mutually insulated, multiple conductor layers. To supply a current to this field winding, a method of using a brushless exciter is available, as well as a brush-utilizing direct excitation technique.

The brushless exciter is a rotary electric machine member separate from a rotary electric machine body and has a size smaller than the rotary electric machine body. The brushless exciter includes its own field winding in the stationary part and an armature winding in the rotary part. When the rotor of the rotary electric machine body is rotated, the magnetic field generated by the field winding of the brushless exciter interlinks the armature winding of the brushless exciter, and power generation takes place. A current from the armature winding is rectified through a rectifier circuit and the thus-obtained direct current is supplied to the field winding of the rotary electric machine body.

The field winding of the rotary electric machine body and the armature winding of the brushless exciter each include interlayer insulations sandwiched between the layers of their conductors so that the conductors are insulated from one another and a short-circuit current is prevented from flowing across the conductors.

A short-circuit between conductors, called an "interlayer short-circuit", occurs due to deterioration, damage, or the like of the interlayer insulations. At the occurrence of an interlayer short-circuit, where the effective number of turns is decreased accordingly, the rotary electric machine may not be able to guarantee the intended performance, and undesirable situations such as reduction in the generated magnetic field would be incurred. Thus, early detection of an interlayer short-circuit is regarded as an important technique. Deterioration of the interlayer insulations may be accelerated not only by deterioration due to aging but also when the temperature of the winding increases according to the change in the operational state. As such, the importance of detecting an interlayer short-circuit is even greater for dealing with rotary electric machines which are frequently used with varying operational conditions and which involve a high likelihood of interlayer short-circuits.

During an ongoing operation of the rotary electric machine having a brushless exciter, if an interlayer short-circuit occurs in the field winding or the armature winding of the brushless exciter, an amount of input to the field winding of the rotary electric machine body will decrease from the normal state. Also, if an interlayer short-circuit occurs in the field winding of the rotary electric machine body, power outputs from the rotary electric machine will decrease. In either case, the field winding of the brushless exciter shows changes in current and voltage values against the normal values. However, such changes due to the occurrence of an interlayer short-circuit are generally overwhelmed by the changes due to inevitable variations in field inputs occurring upon the output or power factor events of the rotary electric machine. Therefore, merely monitoring the amount of current or voltage changes in the field winding of the brushless exciter does not allow for easy detection of an interlayer short-circuit in the windings.

In view of the foregoing, there is a demand for a technique that realizes easy detection of an interlayer short-circuit in the windings of a rotary electric machine having a brushless exciter.

BRIEF DESCRIPTION OF THE DRAWINGS

FIG. 2 is a conceptual diagram showing an exemplary structure of a field winding 30 of a rotary electric machine body 200;

FIG. 4 is a conceptual diagram for explaining electrical circuitry, etc., provided for the rotary electric machine shown in FIG. 1;

FIG. 5 gives examples of circuit equations available for calculations of an armature reaction voltage $AR_{12}$, a voltage $V_{12}$, an armature reaction voltage $AR_{14}$, and a voltage $V_{34}$, which are indicated in FIG. 4;

FIG. 9 is a diagram showing an exemplary operation of the winding interlayer short-circuit detection apparatus 300 according to the second embodiment.

DETAILED DESCRIPTION

The embodiments will be described with reference to the drawings.

In general, according to one embodiment, there is provided a winding interlayer short-circuit detection apparatus applied to a rotary electric machine which includes a brushless exciter, the apparatus comprising a processor configured to perform: a measurement value acquiring process to acquire at least a measurement value of an applied voltage in a field winding of the brushless exciter and a measurement value of a field current in the field winding of the brushless exciter; an armature reaction voltage calculating process to calculate, using the measurement values acquired by the measurement value acquiring process, a value of an armature reaction voltage induced in the field winding of the brushless exciter by an armature winding of the brushless exciter; and an interlayer short-circuit detecting process to detect, based on a difference between the measurement value of the field current acquired by the measurement value acquiring process and a field current reference value prepared in advance, and based on a difference between the calculated value of the armature reaction voltage calculated by the armature reaction voltage calculating process and an armature reaction voltage reference value prepared in advance, a presence or absence of an interlayer short-circuit that may occur in any of the field winding of the brushless exciter, the armature winding of the brushless exciter, and a field winding of a rotary electric machine body of the machine.

First Embodiment

The description starts with the first embodiment.

Figure 1:
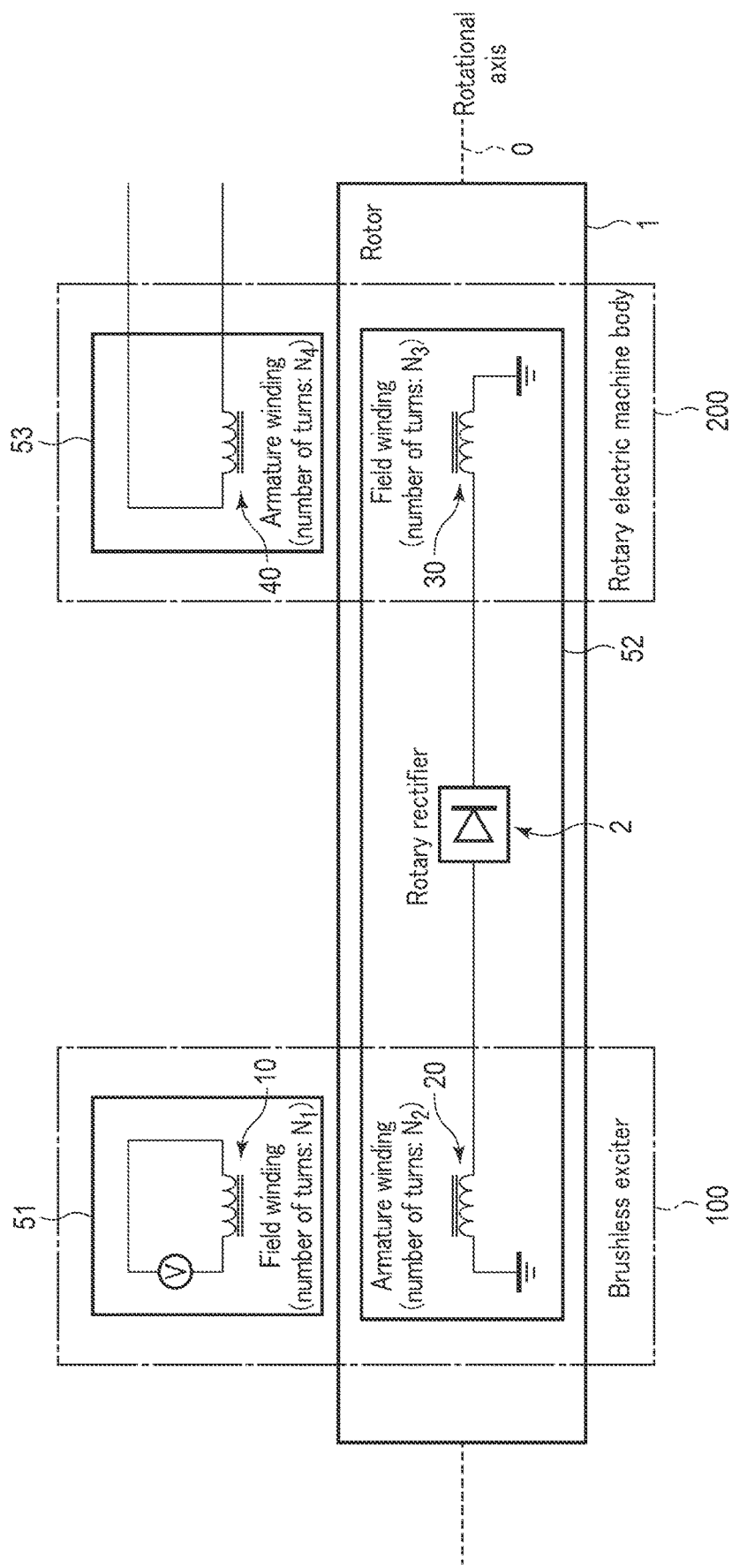
FIG. 1 is a diagram showing exemplary architecture of a rotary electric machine to which a winding interlayer short-circuit detection apparatus according to each embodiment is applied.

FIG. 1 is a diagram showing exemplary architecture of a rotary electric machine to which a winding interlayer short-circuit detection apparatus according to the first embodiment is applied. Note that FIG. 1 may also be referred to for the later described second embodiment.

The rotary electric machine shown by FIG. 1 is a power generator constituted by a brushless exciter 100 and a rotary electric machine body 200, and includes a rotor 1 adapted to rotate about a rotational axis 0 and having a rotary rectifier 2 disposed therewith.

The brushless exciter 100 includes a field winding 10 in the stationary part of the rotary electric machine, and an armature winding 20 in the rotary part (i.e., the rotor 1) of the rotary electric machine. On the other hand, the rotary electric machine body 200 includes a field winding 30 in the rotary part (i.e., the rotor 1) of the rotary electric machine, and an armature winding 40 in the stationary part of the rotary electric machine.

The rotary electric machine includes, as its electrical circuitry components: a circuit 51 arranged in the stationary part of the brushless exciter 100; a circuit 52 arranged in the rotary part (i.e., the rotor 1) of the rotary electric machine in such a manner as to extend across the brushless exciter 100 and the rotary electric machine body 200; and a circuit 53 arranged in the stationary part of the rotary electric machine body 200.

The circuit 51 includes the field winding 10. The circuit 52 includes the armature winding 20, the rotary rectifier 2, and the field winding 30. The circuit 53 includes the armature winding 40.

Here, the structure of the field winding and the armature winding, which may be adopted in the rotary electric machine, will be described.

FIG. 2 is a conceptual diagram showing an exemplary structure of the field winding 30 of the rotary electric machine body 200. The armature winding 20 of the brushless exciter 100 may have a structure equivalent to or similar to that of FIG. 2. Also, the field winding 10 of the brushless exciter 100 and the armature winding 40 of the rotary electric machine body 200 may each be of a structure equivalent to or similar to that of FIG. 2.

According to an exemplary structure, the field winding 30 is constituted by, as shown in FIG. 2, a field winding conductor 31 which is stacked in layers with intervening interlayer insulations 32 and which is wound in a coil shape. The field winding 30 has a rotor core interior part 30a and a rotor core exterior part 30b. There are two conductor ends 31f resting at the rotor core exterior part 30b. FIG. 2 shows only one conductor end 31f.

Figure 3:
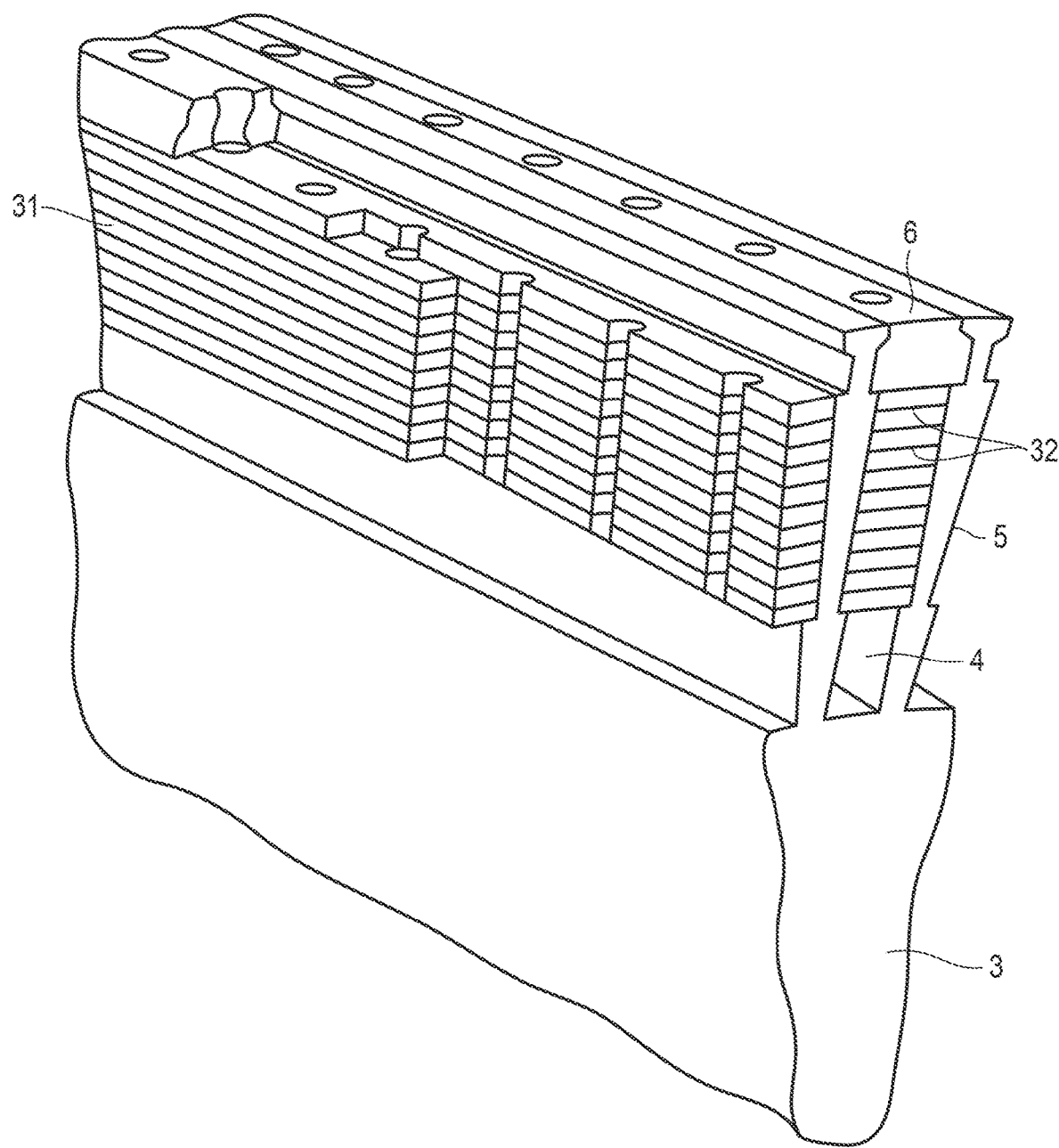
FIG. 3 is a conceptual diagram showing an exemplary structure of a part of the rotary electric machine, for which the field winding 30 of the rotary electric machine body 200 is provided.

FIG. 3 is a conceptual diagram showing an exemplary structure of a part of the rotary electric machine, for which the field winding 30 of the rotary electric machine body 200 is disposed.

A rotor core 3 as a part of the rotary electric machine is provided with, in the neighborhood of its radial surface, multiple rotor slots 4 arranged at intervals in the circumferential direction and each penetrating in the axial direction. The circumferentially consecutive rotor slots 4 form respective rotor teeth 5. The field winding conductor 31 is accommodated in the rotor teeth 5. The field winding conductor 31 forms layers stacked via the interlayer insulations 32 in the radial direction. There is a wedge 6 on the outer radial side of the respective field winding conductor 31 accommodated in the rotor teeth 5. The wedge 6 is fitted between and supported by the corresponding circumferentially consecutive rotor teeth 5. The wedge 6 is adapted to retain the field winding conductor 31 against the centrifugal force that acts in the radially outward direction of the field winding conductor 31 due to the rotation of the rotor 1.

FIG. 4 is a conceptual diagram for explaining electrical circuitry, etc., provided for the rotary electric machine shown in FIG. 1.

The description will assume that the field winding 10 of the brushless exciter 100 has a number of turns $N_1$, the armature winding 20 of the brushless exciter 100 has a number of turns $N_2$, the field winding 30 of the rotary electric machine body 200 has a number of turns $N_3$, and the armature winding 40 of the rotary electric machine body 200 has a number of turns $N_4$.

It will also be assumed that the field winding 10 of the brushless exciter 100 is applied a voltage $V_1$, and that a current $I_1$ flows in the field winding 10 of the brushless exciter 100 while a resistance $r_1$ is present. Note that the application of $V_1$ may utilize a voltage source, or a power generated by the magnetic flux of a permanent magnet.

With the rotor 1 being rotated, the magnetic field generated by the field winding 10 of the brushless exciter 100 interlinks the armature winding 20 of the brushless exciter 100 for power generation. It will be assumed that, as an outcome of this interlinking, a voltage $V_{12}$ is generated in the armature winding 20 of the brushless exciter 100, and that there are a current $I_2$ and a resistance $r_2$. The voltage before the rectification by the rotary rectifier 2 will be assumed to be a voltage $V_2$.

By the power generation at the armature winding 20 of the brushless exciter 100, an armature reaction voltage is induced in the field winding 10 of the brushless exciter 100. This voltage will be assumed to be an armature reaction voltage $AR_{12}$.

The current flowing in the armature winding 20 of the brushless exciter 100 is an alternating current, which is rectified into a direct current by the rotary rectifier 2 and supplied to the field winding 30 of the rotary electric machine body 200. It will be assumed that the voltage after the rectification by the rotary rectifier 2 (i.e., the voltage applied to the field winding 30 of the rotary electric machine body 200) is a voltage $V_3$, and a current $I_3$ flows in the field winding 30 of the rotary electric machine body 200 while a resistance $r_3$ is present.

The magnetic field generated by the field winding 30 of the rotary electric machine body 200 interlinks the armature winding 40 of the rotary electric machine body 200 for power generation. It will be assumed that, as an outcome of this interlinking, a voltage $V_{34}$ is generated in the armature winding 40 of the rotary electric machine body 200, and that there are a current $I_4$ and a resistance $r_4$. The voltage supplied to a grid power grid system P will be assumed to be a voltage $V_4$.

By the power generation at the armature winding 40 of the rotary electric machine body 200, an armature reaction voltage is induced in the field winding 30 of the rotary electric machine body 200. This voltage will be assumed to be an armature reaction voltage $AR_{34}$.

Turning now to a winding interlayer short-circuit detection apparatus 300, it has a function of acquiring at least the measurement value of the applied voltage $V_1$ applied to the field winding 10 of the brushless exciter 100 and the measurement value of the field current $I_1$ flowing in the field winding 10, via a voltage detector and a current detector (not illustrated).

The winding interlayer short-circuit detection apparatus 300 also has a function of calculating the armature reaction voltage $AR_{12}$ induced in the field winding 10 of the brushless exciter 100, using the acquired measurement values.

Moreover, the winding interlayer short-circuit detection apparatus 300 has a function of conducting a given arithmetic process and determining process based on a difference between the acquired measurement value of the field current $I_1$ and a prepared reference value of the field current $I_1$, and a difference between the calculated value of the armature reaction voltage $AR_{12}$ and a prepared reference value of the armature reaction voltage $AR_{12}$, so as to detect the presence or absence of an interlayer short-circuit that may occur in any of the field winding 10 of the brushless exciter 100, the armature winding 20 of the brushless exciter 100, and the field winding 30 of the rotary electric machine body 200.

As the reference value of the field current $I_1$, the present embodiment adopts a measurement value of the field current $I_1$ acquired in the past (for example, acquired a given length of time earlier), which will be denoted by $I_1'$. Also, as the reference value of the armature reaction voltage $AR_{12}$, the embodiment adopts a value of the armature reaction voltage $AR_{12}$ calculated in the past, which will be denoted by $AR_{12}'$.

Note that when the rotary electric machine body 200 is varying its operational conditions (for example, when the output, power factor, and/or the like are varying), the values $V_1$ and $I_1$ can change significantly, making it difficult to judge whether such changes are attributable to the operational conditions or an interlayer short-circuit. Thus, it is desirable for the measurement value, which will serve as a reference value, to be acquired during a steady operation where the operational conditions are kept substantially constant for a given time period.

FIG. 5 gives examples of circuit equations available for calculations of the armature reaction voltage $AR_{12}$, the voltage $V_{12}$, the armature reaction voltage $AR_{34}$, and the voltage $V_{34}$, which are indicated in FIG. 4.

The armature reaction voltage $AR_{12}$ can be obtained from equation (1) in FIG. 5. Equation (1) is a circuit equation for the field winding 10 of the brushless exciter 100. On the right side of equation (1), the rightmost term (the term containing reactance) corresponds to the armature reaction voltage $AR_{12}$. Here, the symbol $v_1$ in equation (1) may be understood as corresponding to $V_1$ in FIG. 4. Also, the symbols $i_1$ and $i_2$ in equation (1) may be understood as corresponding to $I_1$ and $I_2$ in FIG. 4, respectively.

The voltage $V_{12}$ can be obtained from equation (2) in FIG. 5. Equation (2) is a circuit equation (a mathematical model of d-q coordinate system) for the armature winding 20 of the brushless exciter 100. On the right side of equation (2), the rightmost term corresponds to the voltage $V_{12}$. Here, the symbols $v_2^d$ and $v_2^q$ in equation (2) may be understood as corresponding to $V_2$ in FIG. 4. Also, the symbols $i_2^d$ and $i_2^q$ in equation (2) may be understood as corresponding to $I_2$ in FIG. 4. The symbol $i_1$ in equation (2) may be understood as corresponding to $I_1$ in FIG. 4.

The armature reaction voltage $AR_{34}$ can be obtained from equation (3) in FIG. 5. Equation (3) is a circuit equation for the field winding 30 of the rotary electric machine body 200. On the right side of equation (3), the rightmost term (the term containing reactance) corresponds to the armature reaction voltage $AR_{34}$. Here, the symbol $v_3$ in equation (3) may be understood as corresponding to $V_3$ in FIG. 4. Also, the symbols $i_3$ and $i_4$ in equation (3) may be understood as corresponding to $I_3$ and $I_4$ in FIG. 4, respectively.

The voltage $V_{34}$ can be obtained from equation (4) in FIG. 5. Equation (4) is a circuit equation (a mathematical model of a d-q coordinate system) for the armature winding 40 of the rotary electric machine body 200. On the right side of equation (4), the rightmost term corresponds to the voltage $V_{34}$. Here, the symbols $v_4^d$ and $v_4^q$ in equation (4) may be understood as corresponding to $V_4$ in FIG. 4. Also, the symbols $i_4^d$ and $i_4^q$ in equation (4) may be understood as corresponding to $I_4$ in FIG. 4. The symbol $i_3$ in equation (4) may be understood as corresponding to $I_3$ in FIG. 4.

According to the present embodiment, the armature reaction voltage $AR_{12}$ is obtained using equation (1) among these equations (1) to (4).

Figure 6:
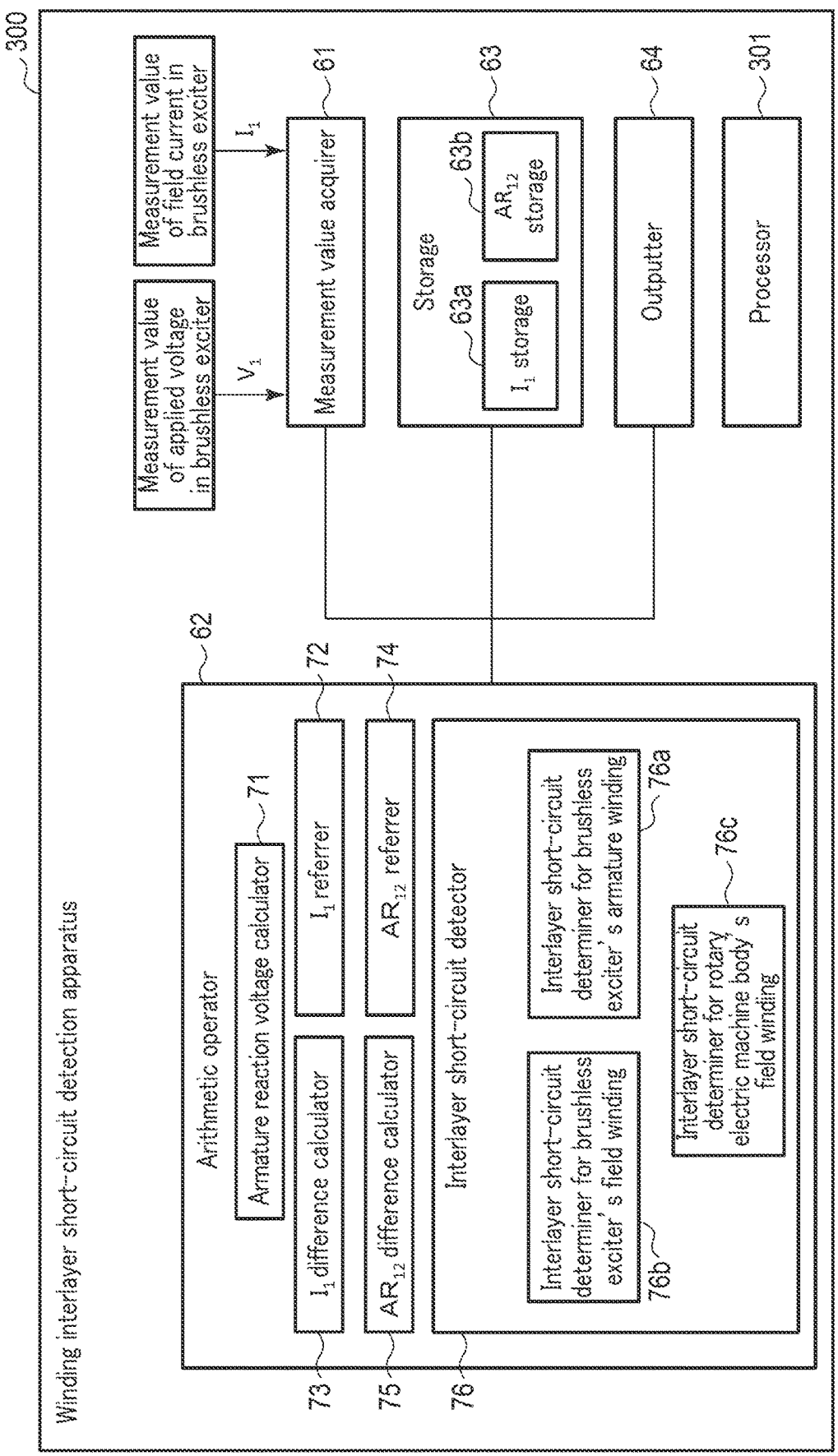
FIG. 6 is a diagram showing an exemplary functional configuration of a winding interlayer short-circuit detection apparatus 300 according to the first embodiment.

FIG. 6 is a diagram showing an exemplary functional configuration of the winding interlayer short-circuit detection apparatus 300 according to the first embodiment.

The winding interlayer short-circuit detection apparatus 300 includes, as its various functions, a measurement value acquirer 61, an arithmetic operator 62, a storage 63, and an outputter 64. The storage 63 includes an $I_1$ storage 63a and an $AR_{12}$ storage 63b. The arithmetic operator 62 includes an armature reaction voltage calculator 71, an $I_1$ referrer 72, an $I_1$ difference calculator 73, an $AR_{12}$ referrer 74, an $AR_{12}$ difference calculator 75, and an interlayer short-circuit detector 76. The interlayer short-circuit detector 76 includes an interlayer short-circuit determiner 76a for the brushless exciter's armature winding, an interlayer short-circuit determiner 76b for the brushless exciter's field winding, and an interlayer short-circuit determiner 76c for the rotary electric machine body's field winding. Such various functions may be collectively or partly realized in the form of, for example, one or more programs executable by a processor 301.

The measurement value acquirer 61 acquires the measurement value of the applied voltage $V_1$ applied to the field winding 10 of the brushless exciter 100 and the measurement value of the field current $I_1$ flowing in the field winding 10. The measurement values to be acquired here may each be an instantaneous value, or instead be a time average or a moving average around the instantaneous value. The acquired measurement values are stored in the storage 63.

The arithmetic operator 62 performs arithmetic processes, determining processes, etc., required for detecting the presence or absence of an interlayer short-circuit that may occur in any of the field winding 10, the armature winding 20, and the field winding 30.

The storage 63 stores various measurement values acquired by the measurement value acquirer 61, as well as data sets including, for example, a value of the resistance $r_1$, a measurement value of the field current $I_1$ acquired in the past, a value of the armature reaction voltage $AR_{12}$ calculated in the past, and so on as the information for use by the arithmetic operator 62 to perform the arithmetic and determining processes, etc.

The $I_1$ storage 63a is adapted to store the measurement value of the field current $I_1$ acquired in the past (namely, $I_1'$). The stored value may be an instantaneous value, or instead be a time average or a moving average around the instantaneous value.

The $AR_{12}$ storage 63b is adapted to store the value of the armature reaction voltage $AR_{12}$ calculated in the past (namely, $AR_{12}'$). The stored value may be an instantaneous value, or instead be a time average or a moving average around the instantaneous value.

The outputter 64 outputs information including the result of detection by the arithmetic operator 62 through screen display, voice, etc.

The armature reaction voltage calculator 71 calculates the armature reaction voltage $AR_{12}$ induced in the field winding 10, using the measurement values of the applied voltage $V_1$ and the field current $I_1$ acquired by the measurement value acquirer 61.

In more concrete terms, the armature reaction voltage calculator 71 estimates the armature reaction voltage $AR_{12}$ from the resistance $r_1$ of the field winding 10, the applied voltage $V_1$, and the field current $I_1$. The armature reaction voltage $AR_{12}$ can be obtained from the following equation (5), which is based on the aforementioned equation (1) in FIG. 5.

$$AR_{12}=V_1-r_1 I_1 \quad (5)$$

This calculation of the armature reaction voltage $AR_{12}$ reflects the winding resistance, which fluctuates depending on the temperature. Nevertheless, the temperature change of the resistance has an influence generally smaller than the electromagnetic reactions, and as such, the temperature changes of the resistance $r_1$ are ignorable. If necessary, the temperature of a cold gas that surrounds the field winding 10, or the coil temperature, may be measured and the value of the resistance $r_1$ may be corrected based on such a measured temperature.

The $I_1$ referrer 72 fetches the previously acquired measurement value of the field current $I_1$ (namely, $I_1'$) that is already stored in the $I_1$ storage 63a, and sets this value to a reference value of the field current $I_1$.

The $I_1$ difference calculator 73 uses the presently acquired value of $I_1$ and the reference value $I_1'$ to obtain their difference (deviation from the reference value). This difference will be denoted by $dI_1$. The difference $dI_1$ can be obtained from the following equation (6).

$$dI_1=I_1-I_1' \quad (6)$$

The $AR_{12}$ referrer 74 fetches the previously calculated value of the armature reaction voltage $AR_{12}$ (namely, $AR_{12}'$) that is already stored in the $AR_{12}$ storage 63b, and sets this value to a reference value of the armature reaction voltage $AR_{12}$.

The $AR_{12}$ difference calculator 75 uses the presently calculated value of $AR_{12}$ and the reference value $AR_{12}'$ to obtain their difference (deviation from the reference value). This difference will be denoted by $dAR_{12}$. The difference $dAR_{12}$ can be obtained from the following equation (7).

$$dAR_{12}=AR_{12}-AR_{12}' \quad (7)$$

The interlayer short-circuit detector 76 performs a given arithmetic process and determining process using multiple determination formulae with the values of $I_1$, $dI_1$, $AR_{12}$, $dAR_{12}$, $N_1$, $N_2$, and $N_3$, so as to detect the presence or absence of an interlayer short-circuit that may occur in any of the field winding 10 of the brushless exciter 100, the armature winding 20 of the brushless exciter 100, and the field winding 30 of the rotary electric machine body 200. Below, the multiple formulae for use in determining the presence or absence of an interlayer short-circuit in the winding will be described for each instance of the windings 10, 20, and 30.

For the rotary electric machine having the brushless exciter 100, the current-and-voltage relationships of the respective components have been given in FIG. 5, and such relationships are each basically understandable as a relationship held by a transformer. According to the equations in FIG. 5, the degree of magnetic coupling depends on the rotational speed, shapes, etc., but what matters most for the detection of an interlayer short-circuit is the number of turns; thus, from the basic formulae for a transformer, the current-and-voltage relationship of each component can be simplified and expressed as:

$$(V_1/V_2)=(N_1/N_2) \quad (8)$$

$$(I_1/I_2)=(N_2/N_1) \quad (9)$$

Also:

$$(V_3/V_4)=(N_3/N_4) \quad (10)$$

$$(I_3/I_4)=(N_4/N_3) \quad (11)$$

Here:

$$I_3=\alpha I_2 \quad (12)$$

(where $\alpha=1$)

As such, the relationship between $I_1$ and $I_4$ is given as follows.

$$I_4=(N_3/N_4)(N_1/N_2) \cdot I_1 \quad (13)$$

From this expression, the following can be said.

When an interlayer short-circuit occurs in the armature winding 20 of the brushless exciter 100, $N_2$ decreases and $I_4$ increases, and accordingly, required $I_1$ decreases. Meanwhile, the decrease in $N_2$ leads to a decrease in $AR_{12}$.

When an interlayer short-circuit occurs in the field winding 10 of the brushless exciter 100, $N_1$ decreases. Accordingly, $I_4$ decreases and required $I_1$ increases. Further, as the $N_1$ decreases, the magnetic coupling with the armature winding 20 of the brushless exciter 100 lowers, and $AR_{12}$ also decreases.

When an interlayer short-circuit occurs in the field winding 30 of the rotary electric machine body 200, $N_3$ decreases. Accordingly, $I_4$ decreases and required $I_1$ increases. On the other hand, the change in $N_3$ does not influence the brushless exciter 100, and therefore, $AR_{12}$ does not change.

Based on the above theory, the interlayer short-circuit detector 76 uses multiple determination formulae as will be set forth, for determining the presence or absence of an interlayer short-circuit in the windings.

The interlayer short-circuit determiner 76a for the brushless exciter's armature winding detects the occurrence of an interlayer short-circuit in the armature winding 20 of the brushless exciter 100 when two conditions defined by the respective formulae (14) and (15) below are both met.

$$(dI_1/I_1)<-(1/(N_2-1)) \quad (14)$$

$$(dAR_{12}/AR_{12})<-(1/(N_2-1)) \quad (15)$$

The interlayer short-circuit determiner 76b for the brushless exciter's field winding detects the occurrence of an interlayer short-circuit in the field winding 10 of the brushless exciter 100 when two conditions defined by the respective formulae (16) and (17) below are both met.

$$(dI_1/I_1)>(1/(N_1-1)) \quad (16)$$

$$(dAR_{12}/AR_{12})<-(1/(N_1-1)) \quad (17)$$

The interlayer short-circuit determiner 76c for the rotary electric machine body's field winding detects the occurrence of an interlayer short-circuit in the field winding 30 of the rotary electric machine body 200 when two conditions defined by the respective formulae (18) and (19) below are both met.

$$(dI_1/I_1)>(1/*N_3-1)) \quad (18)$$

$$(dAR_{12}/AR_{12})\approx 0 \quad (19)$$

Figure 7:
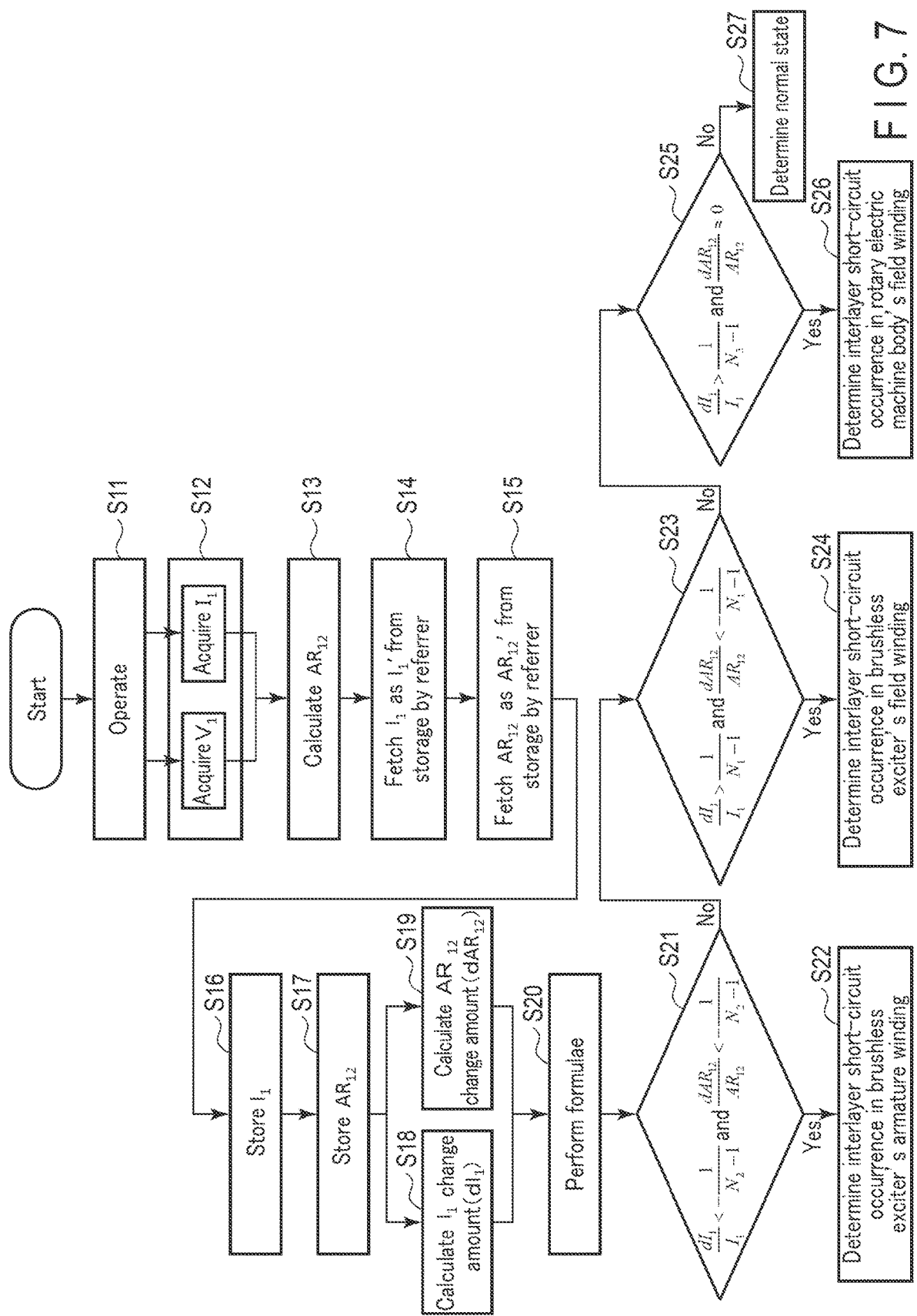
FIG. 7 is a diagram showing an exemplary operation of the winding interlayer short-circuit detection apparatus 300 according to the first embodiment.

Next, an exemplary operation of the winding interlayer short-circuit detection apparatus 300 according the first embodiment will be described with reference to the flowchart in FIG. 7.

The winding interlayer short-circuit detection apparatus 300 repeats the operation described below, at regular intervals.

While the rotary electric machine is in operation (S11), the measurement value acquirer 61 acquires the measurement values of $V_1$ and $I_1$ (S12).

Then, the armature reaction voltage calculator 71 calculates the armature reaction voltage $AR_{12}$ induced in the field winding 10, using the measurement values of $V_1$ and $I_1$ acquired by the measurement value acquirer 61 (S13).

The $I_1$ referrer 72 fetches the measurement value of the field current $I_1$ that was acquired in the past (namely, $I_1'$) and that is already stored in the $I_1$ storage 63a, and sets this value to a reference value of the field current $I_1$ (S14).

Also, the $AR_{12}$ referrer 74 fetches the value of the armature reaction voltage $AR_{12}$ that was calculated in the past (namely, $AR_{12}'$) and that is already stored in the $AR_{12}$ storage 63b, and sets this value to a reference value of the armature reaction voltage $AR_{12}$ (S15).

The value of $I_1$ acquired in step S12 and the value of $AR_{12}$ calculated in step S13 are stored in the $I_1$ storage 63a and the $AR_{12}$ storage 63b, respectively, for use in the next operation (S16 and S17).

Next, the $I_1$ difference calculator 73 uses the presently acquired value of $I_1$ and the reference value $I_1'$ to obtain their difference $dI_1$ (the amount of change of $I_1$) (S18).

Also, the $AR_{12}$ difference calculator 75 uses the presently calculated value of $AR_{12}$ and the reference value $AR_{12}'$ to obtain their difference $dAR_{12}$ (the amount of change of $AR_{12}$) (S19).

The interlayer short-circuit detector 76 performs the arithmetic process, etc., using the multiple determination formulae with the values of $I_1$, $dI_1$, $AR_{12}$, $dAR_{12}$, $N_1$, $N_2$, and $N_3$ (S20).

The interlayer short-circuit detector 76, with the determiner 76a, determines whether or not both of the two conditions defined by the formulae (14) and (15) are met (S21). If yes, the interlayer short-circuit detector 76 determines that an interlayer short-circuit has occurred in the armature winding 20 of the brushless exciter 100 (S22) and sends this information to the outputter 64. If not, the operation flow proceeds to the determination process in step S23.

Next, the interlayer short-circuit detector 76, with the determiner 76b, determines whether or not both of the two conditions defined by the formulae (16) and (17) are met (S23). If yes, the interlayer short-circuit detector 76 determines that an interlayer short-circuit has occurred in the field winding 10 of the brushless exciter 100 (S24) and sends this information to the outputter 64. If not, the operation flow proceeds to the determination process in step S25.

The interlayer short-circuit detector 76, with the determiner 76c, determines whether or not both of the two conditions defined by the formulae (18) and (19) are met (S25). If yes, the interlayer short-circuit detector 76 determines that an interlayer short-circuit has occurred in the field winding 30 of the rotary electric machine body 200 (S26) and sends this information to the outputter 64. If not, the interlayer short-circuit detector 76 determines that the windings are in the normal state as there are no short-circuits in any of the windings (S27), and the series of processing steps comes to an end.

According to the first embodiment, the measurements of the current and voltage in the field winding 10 of the brushless exciter 100 are acquired during the ongoing operation of the rotary electric machine, and items of design information $N_1$, $N_2$, and $N_3$ are used. Accordingly, without necessitating the halt of the rotary electric machine, the embodiment allows for the detection of the presence or absence of an interlayer short-circuit that may occur in any of the field winding 10 of the brushless exciter 100, the armature winding 20 of the brushless exciter 100, and the field winding 30 of the rotary electric machine body 200.

Second Embodiment

The second embodiment will be described. Basically, the description will concentrate on the differences from the first embodiment, while omitting the features or the like that overlap with the first embodiment. What have been discussed above with reference to FIGS. 1 to 5 are also applicable to the second embodiment.

The foregoing first embodiment has assumed the configuration of detecting the occurrence of an interlayer short-circuit in the windings during a steady operation, based on the differences between the measurement value of $I_1$ and the calculated value of $AR_{12}$, obtained at a given time point, and the measurement value of $I_1$ and the calculated value of $AR_{12}$, obtained a given length of time earlier. Here, an interlayer short-circuit that occurs in the windings during the period of a steady operation can be detected, but if an interlayer short-circuit occurs in the windings during a non-steady operation period, the configuration might not promise easy detection of the subsequent interlayer short-circuits. The second embodiment offers a solution to such a problem.

Figure 8:
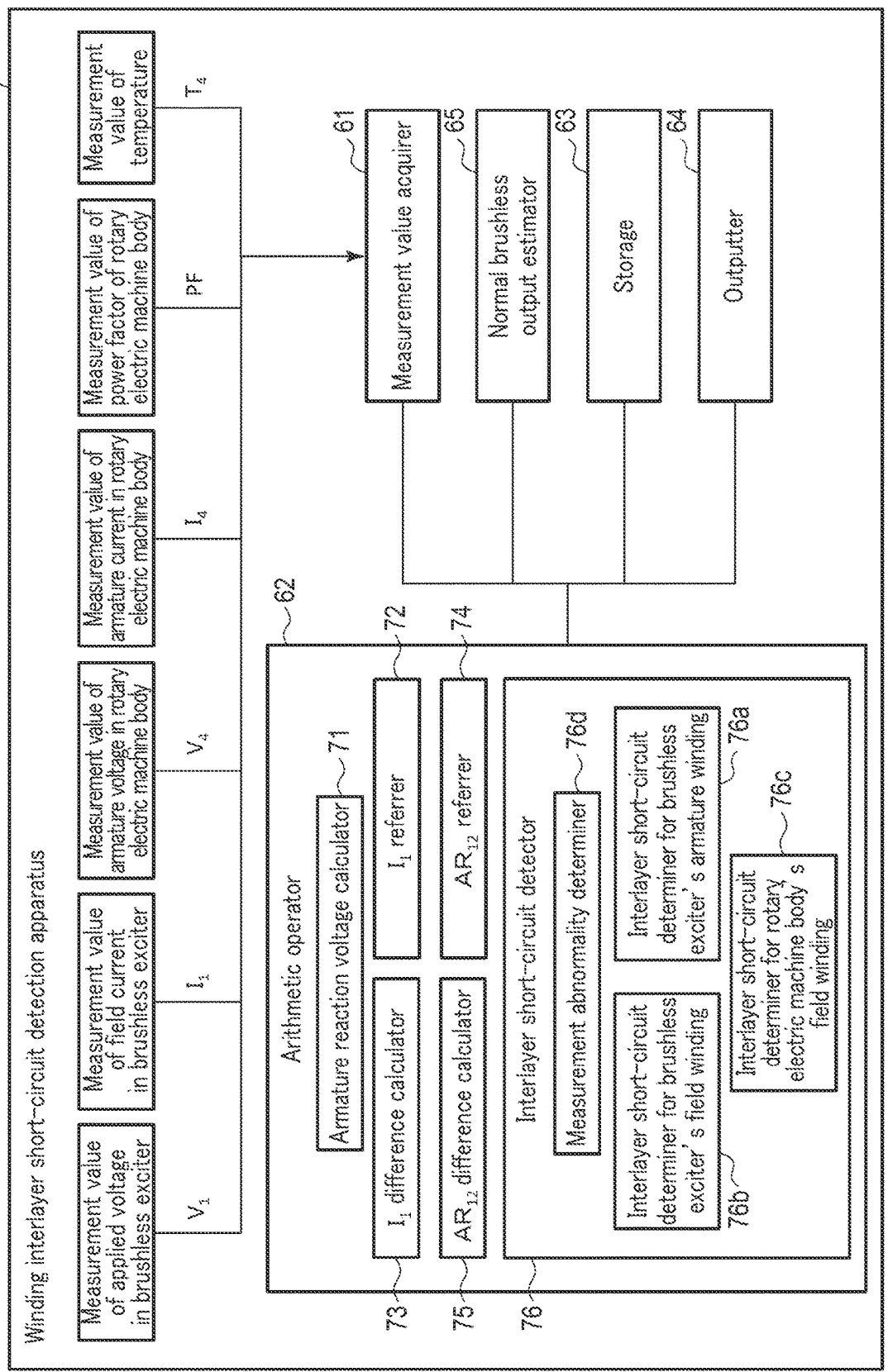
FIG. 8 is a diagram showing an exemplary functional configuration of a winding interlayer short-circuit detection apparatus 300 according to the second embodiment.

FIG. 8 is a diagram showing an exemplary functional configuration of a winding interlayer short-circuit detection apparatus 300 according to the second embodiment. Note that the figure and the description will use the same reference signs for the elements or features common to FIG. 6, so that repetition will be avoided.

The first embodiment has adopted a previously acquired measurement value of the field current (namely, $I_1'$) as the reference value of the field current $I_1$, and a previously calculated value of the armature reaction voltage $AR_{12}$ (namely, $AR_{12}'$) as the reference value of the armature reaction voltage $AR_{12}$.

In contrast, the second embodiment adopts, as the reference value of the field current $I_1$, an estimated normal operation value of the field current $I_1$ in the field winding 10 of the brushless exciter 100, and such an estimated value will be denoted by $I_1''$. Also, as the reference value of the armature reaction voltage $AR_{12}$, the second embodiment adopts a value of the armature reaction voltage $AR_{12}$, calculated using the estimated normal operation values of the applied voltage $V_1$ and the field current $I_1$ in the field winding 10 of the brushless exciter 100, and such a calculated value will be denoted by $AR_{12}"$.

The measurement value acquirer 61, in addition to acquiring each of the measurement values of the applied voltage $V_1$ and the field current $I_1$ in the field winding 10 as discussed above, further acquires each of the measurement values of the armature voltage $V_4$ and the armature current $I_4$ in the armature winding 40, and the power factor PF, as well as the measurement value of a representative point temperature $T_4$ of a cold gas for the rotary electric machine body 200 or of the armature winding 40. The acquired measurement values are stored in the storage 63.

The winding interlayer short-circuit detection apparatus 300 according to the embodiment additionally includes a normal brushless output estimator 65. The normal brushless output estimator 65 estimates the normal operation values of the applied voltage (i.e., $V_1"$) and the field current (i.e., $I_1"$) in the field winding 10 of the brushless exciter 100, based on the measurement values of $V_4$, $I_4$, PF, and $T_4$ acquired by the measurement value acquirer 61.

This estimation may simply utilize a look-up table storing correspondences between inputs and outputs, or utilize an inference model that gives inferences of correspondences between inputs and outputs based on a machine learning process. Here, the inputs may be values of $I_4$, $V_4$, PF, and $T_4$, and the outputs may be values of $I_1$ and $V_1$. Training of the inference model can use data of $I_4$, $V_4$, PF, and $T_4$ for the inputs and data of $I_1$ and $V_1$ for the outputs, which may be any of measurement data obtained during normal operations, design calculation data obtained at the time of the design, or sets of data generated based on numerical simulations on computers. Such data, values, etc. may be combined and corrected for consistency with actual situations.

In the winding interlayer short-circuit detection apparatus 300 according to the embodiment, the arithmetic operator 62 further includes a measurement abnormality determiner 76d.

The measurement abnormality determiner 76d determines whether or not there is a significant difference between the measured values ($V_1$ and $I_1$) and the estimated values ($V_1"$ and $I_1"$). If yes, the detection of an interlayer short-circuit in the windings is carried out.

Determining whether or not there is a significant difference may employ, for example, the following equation (20).

$$E=(V_1-V_1")^2+(I_1+I_1")^2 \quad (20)$$

The presence of the significant difference may be determined if the value of E in this equation (20) is calculated to be equal to or greater than a preset threshold.

The value of E is influenced by noise. Thus, as another option, probability distribution representing the likelihood of occurrence of the respective value of E may be prepared in advance by calculating multiple values of E using multiple sets of $V_1$ and $I_1$ measured during the normal operations and the estimated $V_1"$ and $I_1"$. Then, the presence of the significant difference may be determined if the likelihood of occurrence of the presently calculated value of E falls under a predetermined range in the probability distribution.

The armature reaction voltage calculator 71 calculates the armature reaction voltage $AR_{12}$ induced in the field winding 10, using the measurement values of $V_1$ and $I_1$ acquired by the measurement value acquirer 61. The armature reaction voltage calculator 71 further calculates, in response to the measurement abnormality determiner 76d determining that there is a significant difference, the armature reaction voltage $AR_{12}"$ that is expected to be induced in the field winding 10, based on the estimated values $V_1"$ and $I_1"$.

The $I_1$ referrer 72 sets the estimated value $I_1"$ to a reference value of the field current $I_1$.

The $I_1$ difference calculator 73 uses the presently acquired value of $I_1$ and the reference value $I_1"$ to obtain their difference (deviation from the reference value). This difference will be denoted by $dI_1$. The difference $dI_1$ can be obtained from the following equation (21).

$$dI_1=I_1-I_1" \quad (21)$$

The $AR_{12}$ referrer 74 sets the calculated value $AR_{12}"$ to a reference value of the armature reaction voltage $AR_{12}$.

The $AR_{12}$ difference calculator 75 uses the presently calculated value of $AR_{12}$ and the reference value $AR_{12}"$ to obtain their difference (deviation from the reference value). This difference will be denoted by $dAR_{12}$. The difference $dAR_{12}$ can be obtained from the following equation (22).

$$dAR_{12}=AR_{12}-AR_{12}" \quad (22)$$

The interlayer short-circuit detector 76 (with the interlayer short-circuit determiner 76a for the brushless exciter's armature winding, the interlayer short-circuit determiner 76b for the brushless exciter's field winding, and the interlayer short-circuit determiner 76c for the rotary electric machine body's field winding) performs, as in the first embodiment, the arithmetic process, etc., using the multiple determination formulae with the values of $I_1$, $dI_1$, $AR_{12}$, $dAR_{12}$, $N_1$, $N_2$, and $N_3$, so as to detect the presence or absence of an interlayer short-circuit that may occur in any of the field winding 10 of the brushless exciter 100, the armature winding 20 of the brushless exciter 100, and the field winding 30 of the rotary electric machine body 200. Note that such multiple formulae for use in determining the presence or absence of an interlayer short-circuit in each of the windings 10, 20, and 30 are the same as the formulae (14) to (19) in the foregoing description.

Next, an exemplary operation of the winding interlayer short-circuit detection apparatus 300 according the second embodiment will be described with reference to the flowchart in FIG. 9.

The winding interlayer short-circuit detection apparatus 300 repeats the operation described below, at regular intervals.

While the rotary electric machine is in operation (S31), the measurement value acquirer 61 acquires the measurement values of $V_1$, $I_1$, $V_4$, $I_4$, PF, and $T_4$ (S32).

Then, the armature reaction voltage calculator 71 calculates the armature reaction voltage $AR_{12}$ induced in the field winding 10, using the measurement values of $V_1$ and $I_1$ acquired by the measurement value acquirer 61 (S33).

Next, the normal brushless output estimator 65 estimates the normal operation values of the applied voltage (i.e., $V_1"$) and the field current (i.e., $I_1"$) in the field winding 10 of the brushless exciter 100, based on the measurement values of $V_4$, $I_4$, PF, and $T_4$ acquired by the measurement value acquirer 61 (S34).

The measurement abnormality determiner 76d determines whether or not there is a significant difference between the measured values of $V_1$ and $I_1$ and the estimated values $V_1"$ and $I_1"$ (S35). If not, the windings are determined to be in the normal state as there are no short-circuits in any of the windings (S36). If there is a significant difference, the operation flow proceeds to step S37.

Then, the armature reaction voltage calculator 71 calculates the armature reaction voltage $AR_{12}''$ expected to be induced in the field winding 10, using the estimated values $V_1''$ and $I_1''$ (S37).

The $I_1$ referrer 72 sets the estimated value $I_1''$ to a reference value of the field current $I_1$ (S38). Also, the $AR_{12}$ referrer 74 sets the calculated value $AR_{12}''$ to a reference value of the armature reaction voltage $AR_{12}$ (S39).

Next, the interlayer short-circuit detector 76 performs the arithmetic process, etc., using the multiple determination formulae with the values of $I_1$, $dI_1$, $AR_{12}$, $dAR_{12}$, $N_1$, $N_2$, and $N_3$ (S40).

The interlayer short-circuit detector 76, with the determiner 76a, determines whether or not both of the two conditions defined by the formulae (14) and (15) are met (S41). If yes, the interlayer short-circuit detector 76 determines that an interlayer short-circuit has occurred in the armature winding 20 of the brushless exciter 100 (S42) and sends this information to the outputter 64. If not, the operation flow proceeds to the determination process in step S43.

The interlayer short-circuit detector 76, with the determiner 76b, determines whether or not both of the two conditions defined by the formulae (16) and (17) are met (S43). If yes, the interlayer short-circuit detector 76 determines that an interlayer short-circuit has occurred in the field winding 10 of the brushless exciter 100 (S44) and sends this information to the outputter 64. If not, the operation flow proceeds to the determination process in step S45.

The interlayer short-circuit detector 76, with the determiner 76c, determines whether or not both of the two conditions defined by the formulae (18) and (19) are met (S45). If yes, the interlayer short-circuit detector 76 determines that an interlayer short-circuit has occurred in the field winding 30 of the rotary electric machine body 200 (S46) and sends this information to the outputter 64. If not, the interlayer short-circuit detector 76 determines that the values of V1 and I1 have deviated from the values in normal operations, and gives the outputter 64 a warning about the possibility of abnormality occurrence that is due to a cause different from the interlayer short-circuit in the windings (S47). Then, the series of processing steps comes to the end.

According to the second embodiment, the measurements of the current and voltage in the field winding 10 of the brushless exciter 100 are acquired during the ongoing operation of the rotary electric machine, and further, each of the measurements of the current and voltage in the armature winding 40 of the rotary electric machine body 200 and the power factor, as well as the measurement of the cold gas temperature, etc. are acquired. Accordingly, the second embodiment allows for the estimation of the normal operation values of the applied voltage and the field current in the field winding 10 of the brushless exciter 100. Then, if there is a significant difference between such estimated values and the measured values, the presence or absence of an interlayer short-circuit in each winding is determined. Thus, even in the event where an interlayer short-circuit occurs in any of the windings during a non-steady operation period, subsequent occurrence of an interlayer short-circuit can be appropriately detected. Moreover, even if no interlayer short-circuit is involved in any of the windings, a warning that calls attention to the possibility of other causes of abnormality can be issued.

As described above, each of the embodiments enables easy detection of the presence or absence of an interlayer short-circuit in the windings of the rotary electric machine having a brushless exciter.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made. The accompanying claims and their equivalents are intended to cover such forms or modifications as would fall within the scope of the inventions.

The invention claimed is:

1. A winding interlayer short-circuit detection apparatus applied to a rotary electric machine which includes a brushless exciter, the apparatus comprising:
   a processor configured to perform:
   a measurement value acquiring process to acquire at least a measurement value of an applied voltage in a field winding of the brushless exciter and a measurement value of a field current in the field winding of the brushless exciter;
   an armature reaction voltage calculating process to calculate, using the measurement values acquired by the measurement value acquiring process, a value of an armature reaction voltage induced in the field winding of the brushless exciter by an armature winding of the brushless exciter; and
   an interlayer short-circuit detecting process to detect, based on a difference between the measurement value of the field current acquired by the measurement value acquiring process and a field current reference value prepared in advance, and based on a difference between the calculated value of the armature reaction voltage calculated by the armature reaction voltage calculating process and an armature reaction voltage reference value prepared in advance, a presence or absence of an interlayer short-circuit that may occur in any of the field winding of the brushless exciter, the armature winding of the brushless exciter, and a field winding of a rotary electric machine body of the machine.

2. The winding interlayer short-circuit detection apparatus according to claim 1, wherein
   the field current reference value is a measurement value of the field current that was previously acquired by the measurement value acquiring process, and
   the armature reaction voltage reference value is a calculated value of the armature reaction voltage that was previously calculated by the armature reaction voltage calculating process.

3. The winding interlayer short-circuit detection apparatus according to claim 1, wherein
   the field current reference value is an estimated normal operation value of the field current in the field winding of the brushless exciter, and
   the armature reaction voltage reference value is a calculated value of the armature reaction voltage calculated using normal operation values of the applied voltage and the field current in the field winding of the brushless exciter.

4. The winding interlayer short-circuit detection apparatus according to claim 3, wherein
   the measurement value acquiring process comprises further acquiring measurement values of an armature voltage and an armature current in the armature winding of the rotary electric machine body, and a power factor, as well as a measurement value of a representative point temperature of a cold gas for the rotary electric machine body or of the armature winding of the rotary electric machine body, and the processor is further configured to perform a normal brushless output estimating process to estimate the normal operation values of the applied voltage and the field current in the field winding of the brushless exciter, based on the measurement values of the armature voltage and the armature current in the armature winding of the rotary electric machine body, the power factor, and the measurement value of the representative point temperature of the cold gas or the armature winding of the rotary electric machine body.

5. The winding interlayer short-circuit detection apparatus according to claim 4, wherein the interlayer short-circuit detecting process comprises determining whether or not there is a significant difference between the measurement values of the applied voltage and the field current in the field winding of the brushless exciter and the estimated normal operation values of the applied voltage and the field current in the field winding of the brushless exciter, and detecting the presence or absence of an interlayer short-circuit if there is the significant difference.

6. The winding interlayer short-circuit detection apparatus according to claim 5, wherein the interlayer short-circuit detecting process comprises calculating an equation represented by $$E=(V_1-V_1'')^2+(I_1+I_1'')^2$$

wherein $V_1$ and $I_1$ respectively are the measurement values of the applied voltage and the field current in the field winding of the brushless exciter, and $V_1''$ and $I_1''$ respectively are the estimated normal operation values of the applied voltage and the field current in the field winding of the brushless exciter, and determining that there is the significant difference if E in the equation is calculated to be equal to or greater than a preset threshold, or if a likelihood of occurrence of a value of E falls under a predetermined range in probability distribution which represents a likelihood of occurrence of a respective value of E and which has been prepared in advance by calculating multiple values of E using multiple sets of $V_1$ and $I_1$ measured during a normal operation and the estimated $V_1''$ and $I_1''$.

7. The winding interlayer short-circuit detection apparatus according to claim 1, wherein the interlayer short-circuit detecting process comprises determining that an interlayer short-circuit has occurred in the armature winding of the brushless exciter if both formulae below are true:

$$(dI_1/I_1)<-(1/(N_2-1))$$

$$(dAR_{12}/AR_{12})<-(1/(N_2-1))$$

wherein $I_1$ is the measurement value of the field current in the field winding of the brushless exciter, $dI_1$ is a difference between $I_1$ and the field current reference value, $N_2$ is a number of turns of the armature winding of the brushless exciter, $AR_{12}$ is the calculated value of the armature reaction voltage induced in the field winding of the brushless exciter, and $dAR_{12}$ is a difference between $AR_{12}$ and the armature reaction voltage reference value.

8. The winding interlayer short-circuit detection apparatus according to claim 1, wherein the interlayer short-circuit detecting process comprises determining that an interlayer short-circuit has occurred in the field winding of the brushless exciter if both formulae below are true:

$$(dI_1/I_1)>(1/(N_1-1))$$

$$(dAR_{12}/AR_{12})<-(1/(N_1-1))$$

wherein $I_1$ is the measurement value of the field current in the field winding of the brushless exciter, $dI_1$ is a difference between $I_1$ and the field current reference value, $N_1$ is a number of turns of the field winding of the brushless exciter, $AR_{12}$ is the calculated value of the armature reaction voltage induced in the field winding of the brushless exciter, and $dAR_{12}$ is a difference between $AR_{12}$ and the armature reaction voltage reference value.

9. The winding interlayer short-circuit detection apparatus according to claim 1, wherein the interlayer short-circuit detecting process comprises determining that an interlayer short-circuit has occurred in the field winding of the rotary electric machine body if both formulae below are true:

$$(dI_1/I_1)>(1/(N_3-1))$$

$$(dAR_{12}/AR_{12})\approx 0$$

wherein $I_1$ is the measurement value of the field current in the field winding of the brushless exciter, $dI_1$ is a difference between $I_1$ and the field current reference value, $N_3$ is a number of turns of the field winding of the rotary electric machine body, $AR_{12}$ is the calculated value of the armature reaction voltage induced in the field winding of the brushless exciter, and $dAR_{12}$ is a difference between $AR_{12}$ and the armature reaction voltage reference value.

10. A winding interlayer short-circuit detection method applied to a rotary electric machine which includes a brushless exciter, the method comprising:

executing a measurement value acquiring process to acquire at least a measurement value of an applied voltage in a field winding of the brushless exciter and a measurement value of a field current in the field winding of the brushless exciter;

executing an armature reaction voltage calculating process to calculate, using the measurement values acquired by the measurement value acquiring process, a value of an armature reaction voltage induced in the field winding of the brushless exciter by an armature winding of the brushless exciter; and executing an interlayer short-circuit detecting process to detect, based on a difference between the measurement value of the field current acquired by the measurement value acquiring process and a field current reference value prepared in advance, and based on a difference between the calculated value of the armature reaction voltage calculated by the armature reaction voltage calculating process and an armature reaction voltage reference value prepared in advance, a presence or absence of an interlayer short-circuit that may occur in any of the field winding of the brushless exciter, the armature winding of the brushless exciter, and a field winding of a rotary electric machine body of the machine.

11. The winding interlayer short-circuit detection method according to claim 10, wherein
the field current reference value is a measurement value of the field current that was previously acquired by the measurement value acquiring process, and
the armature reaction voltage reference value is a calculated value of the armature reaction voltage that was previously calculated by the armature reaction voltage calculating process.

12. The winding interlayer short-circuit detection method according to claim 10, wherein
the field current reference value is an estimated normal operation value of the field current in the field winding of the brushless exciter, and
the armature reaction voltage reference value is a calculated value of the armature reaction voltage calculated using normal operation values of the applied voltage and the field current in the field winding of the brushless exciter.

13. The winding interlayer short-circuit detection method according to claim 12, wherein
the measurement value acquiring process comprises further acquiring measurement values of an armature voltage and an armature current in the armature winding of the rotary electric machine body, and a power factor, as well as a measurement value of a representative point temperature of a cold gas for the rotary electric machine body or of the armature winding of the rotary electric machine body, and
the method further comprises performing a normal brushless output estimating process to estimate the normal operation values of the applied voltage and the field current in the field winding of the brushless exciter, based on the measurement values of the armature voltage and the armature current in the armature winding of the rotary electric machine body, the power factor, and the measurement value of the representative point temperature of the cold gas or the armature winding of the rotary electric machine body.

14. The winding interlayer short-circuit detection method according to claim 13, wherein the interlayer short-circuit detecting process comprises
determining whether or not there is a significant difference between the measurement values of the applied voltage and the field current in the field winding of the brushless exciter and the estimated normal operation values of the applied voltage and the field current in the field winding of the brushless exciter, and
detecting the presence or absence of an interlayer short-circuit if there is the significant difference.

15. The winding interlayer short-circuit detection method according to claim 14, wherein the interlayer short-circuit detecting process comprises
calculating an equation represented by $$E = (V_1 - V_1'')^2 + (I_1 + I_1'')^2$$

wherein
$V_1$ and $I_1$ respectively are the measurement values of the applied voltage and the field current in the field winding of the brushless exciter, and $V_1''$ and $I_1''$ respectively are the estimated normal operation values of the applied voltage and the field current in the field winding of the brushless exciter, and
determining that there is the significant difference
if E in the equation is calculated to be equal to or greater than a preset threshold, or
if a likelihood of occurrence of a value of E falls under a predetermined range in probability distribution which represents a likelihood of occurrence of a respective value of E and which has been prepared in advance by calculating multiple values of E using multiple sets of $V_1$ and $I_1$ measured during a normal operation and the estimated $V_1''$ and $I_1''$.

16. The winding interlayer short-circuit detection method according to claim 10, wherein the interlayer short-circuit detecting process comprises determining that an interlayer short-circuit has occurred in the armature winding of the brushless exciter if both formulae below are true:

$$(dI_1/I_1) < -(1/(N_2-1))$$

$$(dAR_{12}/AR_{12}) < -(1/(N_2-1))$$

wherein
$I_1$ is the measurement value of the field current in the field winding of the brushless exciter,
$dI_1$ is a difference between $I_1$ and the field current reference value,
$N_2$ is a number of turns of the armature winding of the brushless exciter,
$AR_{12}$ is the calculated value of the armature reaction voltage induced in the field winding of the brushless exciter, and
$dAR_{12}$ is a difference between $AR_{12}$ and the armature reaction voltage reference value.

17. The winding interlayer short-circuit detection method according to claim 10, wherein the interlayer short-circuit detecting process comprises determining that an interlayer short-circuit has occurred in the field winding of the brushless exciter if both formulae below are true:

$$(dI_1/I_1) > (1/(N_1-1))$$

$$(dAR_{12}/AR_{12}) < -(1/(N_1-1))$$

wherein
$I_1$ is the measurement value of the field current in the field winding of the brushless exciter,
$dI_1$ is a difference between $I_1$ and the field current reference value,
$N_1$ is a number of turns of the field winding of the brushless exciter,
$AR_{12}$ is the calculated value of the armature reaction voltage induced in the field winding of the brushless exciter, and
$dAR_{12}$ is a difference between $AR_{12}$ and the armature reaction voltage reference value.

18. The winding interlayer short-circuit detection method according to claim 10, wherein the interlayer short-circuit detecting process comprises determining that an interlayer short-circuit has occurred in the field winding of the rotary electric machine body if both formulae below are true:

$$(dI_1/I_1) > (1/(N_3-1))$$

$$(dAR_{12}/AR_{12}) \approx 0$$

wherein
$I_1$ is the measurement value of the field current in the field winding of the brushless exciter, $dI_1$ is a difference between $I_1$ and the field current reference value, $N_3$ is a number of turns of the field winding of the rotary electric machine body, $AR_{12}$ is the calculated value of the armature reaction voltage induced in the field winding of the brushless exciter, and $dAR_{12}$ is a difference between $AR_{12}$ and the armature reaction voltage reference value.

\* \* \* \* \*